… … … … … … … … … … … … … … … … US005392119A

United States Patent [19]
McArthur et al.

[11] Patent Number: 5,392,119
[45] Date of Patent: Feb. 21, 1995

[54] PLATE CORRECTION OF IMAGING SYSTEMS

[75] Inventors: Bruce B. McArthur, San Diego; Robert O. Hunter, Jr., Rancho Santa Fe; Adlai H. Smith, San Diego, all of Calif.

[73] Assignee: Litel Instruments, San Diego, Calif.

[21] Appl. No.: 91,669

[22] Filed: Jul. 13, 1993

[51] Int. Cl.⁶ .................................................. G01B 9/02
[52] U.S. Cl. ...................................... 356/355; 356/124
[58] Field of Search ................ 356/355, 124; 359/859, 359/370, 558, 738

[56] References Cited

U.S. PATENT DOCUMENTS

| 4,861,148 | 8/1989 | Sato et al. | 359/859 |
| 5,013,133 | 5/1991 | Buralli et al. | 359/558 |
| 5,136,413 | 8/1992 | MacDonald et al. | 359/213 |

Primary Examiner—Davis L. Willis
Assistant Examiner—Russell C. Wolfe
Attorney, Agent, or Firm—Townsend and Townsend Khourie and Crew

[57] ABSTRACT

An object is projected through the lens system to be corrected to the image plane where the position of the diffraction limited ideal image is readily ascertainable. At least one primary image defect or Seidel Aberration is measured. These aberrations include distortion, curvature of field or Petzval curvature, spherical aberration, coma, and astigmatism. Interferometry is one technique typically used to measure the aberrations of the system. Based on the measurements, the location of an apparent object is computed. The apparent object is an imaginary location of the object which would cause the image of the object to register to the diffraction limited ideal image. Although only one corrector plate may be required to achieve the desired optical system performance improvements, in the preferred embodiment at least two corrector plate mounting planes are designed and mounts made for the insertion of first and second corrector plates to correct beam convergence and focus to the ideal image. In the analysis offered, provision is made to insert to a medial location a phase conjugate plate for the correction of systematic lens system errors. A matrix of test points is utilized to locally correct, on an individually measured basis, lens systems through customized corrector plates individually tailored to each lens system. There results a simplified lens system correctly customized to each particular lens system which assists in approaching the diffraction limit of the optical system. Both the process and the product of the process can be used to either improve existing lens trains or ease the fabrication of new lens trains.

30 Claims, 7 Drawing Sheets

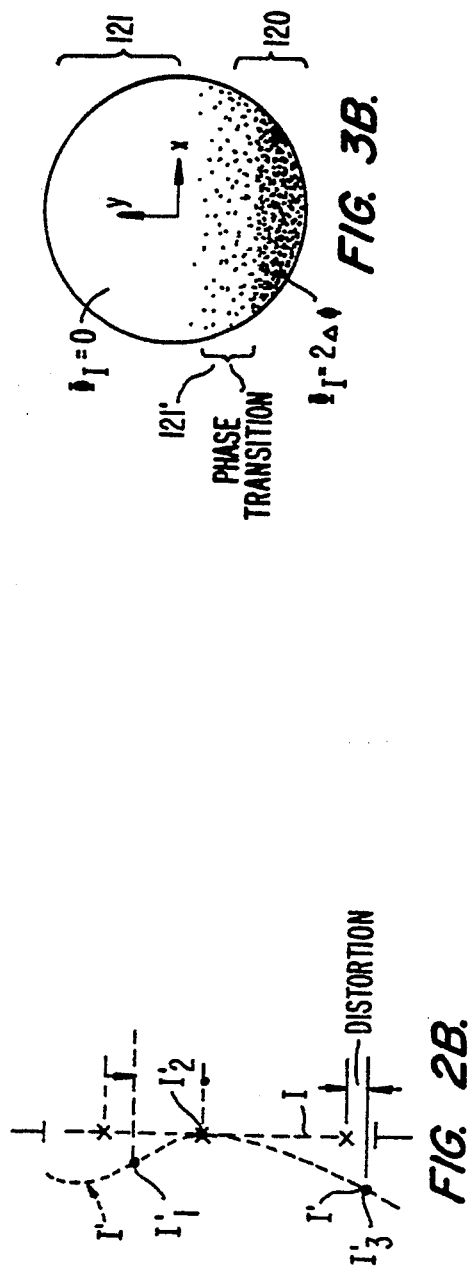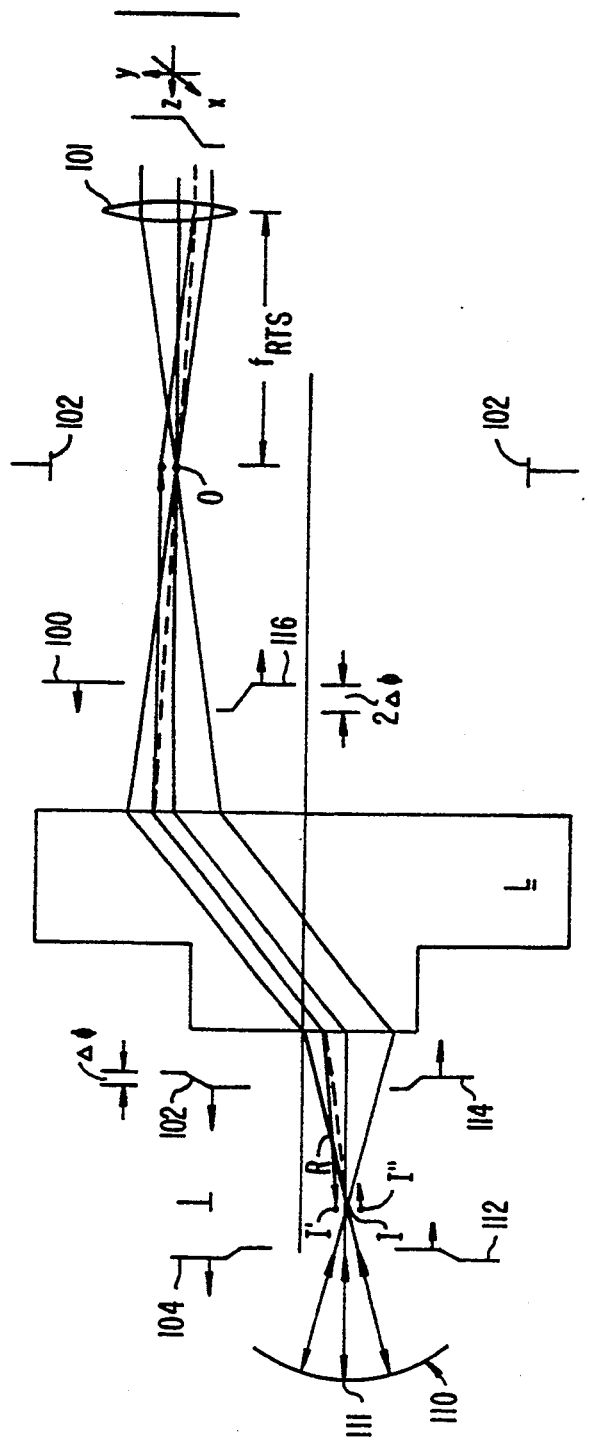
FIG. 3B.
FIG. 3A.
FIG. 2B.

PLATE CORRECTION OF IMAGING SYSTEMS

This invention relates to the correction of extant optical systems by the insertion of so-called "corrector plates" into such optical systems. More particularly, a method and resulting lens product is illustrated which results from the measurement of the aberrations of an extant lens system followed by the subsequent design and insertion of custom designed corrector plates to effect the desired correction of the error. In brief, the measurements determine how optical rays traverse the optical system. From these measurements it can be deduced how ideal image rays would traverse back through the system. The corrector plates then place the "real" rays on the "desired" trajectories. The process and product of the process enables an optical system, for example the lens train from a stepper, to approach its theoretical diffraction limited performance.

BACKGROUND OF THE INVENTION

In MacDonald et al. U.S. Pat. No. 5,136,413 issued Aug. 14, 1992, entitled IMAGING AND ILLUMINATION SYSTEM WITH ASPHERIZATION AND ABERRATION CORRECTION BY PHASE STEPS, an imaging system is disclosed which uses phase plates. This reference is assigned to the assignee hereof and is incorporated into this disclosure by reference.

This MacDonald et al. imaging system has the aspherization and aberration correction in the original imaging system design corrected by the insertion of two phase plates, these phase plates each having differing distances from the lenses of the imaging system. The first phase plate is an aplanatism plate which acts as an asphere to place each light ray within the correct position on the second phase plate to satisfy the so-called "sine" condition. This sine condition is satisfied when the ratio of the sine of the angles made between corresponding rays at the object and image points and the axis of the optical system is constant. The second phase plate is an axial stigmatism plate which ensures that each ray with the beam focuses at the focal point.

While the subsequent discussion is confined to lens or refractive imaging systems, it is to be understood that the methods and techniques described herein apply word for word to reflective and catadioptric imaging systems.

The entire MacDonald et al. disclosure is directed to the simplified construction of a lens system so that the aspherization and aberration correction do not have to be added to the surfaces of the optical elements of the system. A lens system built with the disclosed phase plates has vastly simplified lens surface configuration.

Unfortunately, lens systems commonly contain both individual optic fabrication errors as well as mounting errors. Systematic errors, generally a result of design errors, are also not uncommon. As a result of these various errors a system will normally include one or more primary image defects, usually referred to as the Seidel Aberrations. Such aberrations can include distortion, curvature of field, spherical aberration, coma, and astigmatism. Only a system which is theoretically perfect in design, fabrication, and assembly will be free of these effects. This theoretically perfect optical system is sometimes referred in the art as being "diffraction limited." It is only the diffractive properties of the light passing through the lens that limit the lens system optical performance.

The present invention is aimed at correction of existing lens system errors so that they may more closely approach this diffraction limit. Since lens systems fail to approach the diffraction limit because of individual optic design, fabrication, and mounting errors as well as systematic errors, the phase plates used in the following specification will be different for each lens system corrected.

The disclosed invention has at least two distinct useful areas. First, existing lens systems can be modified. For example, on existing steppers utilized in the construction of micro chips and circuits, the original optical resolution can be improved to achieve the required higher resolution for new (smaller) generations of chips and circuits thereby avoiding the considerable cost of stepper replacement. In addition, laser machining tools utilizing projection imaging can be improved to have better resolution. Second, new lens systems can be fabricated more economically utilizing the disclosed technique. For example, stepper lens systems can be designed with intervals within the lens system to receive the specially designed plates of this invention. With such a lens system, the original costs of producing the stepper lens system can be reduced.

Having noted that this invention finds utility both with new and existing lens systems, the difference between the invention herein and that of the MacDonald et al. disclosure must be understood. Following the teaching of MacDonald, similar phase plates for similar lens systems will be utilized. Following the teaching of the present disclosure will theoretically yield different phase plates for similar lens systems to correct the inevitably different and random errors of lens system construction.

Having established this distinction, and before reading the following specification, some attention to terminology is useful.

This invention is primarily directed toward imaging systems, although minor variations in the technique would make it apply to other optical applications. In order to measure the imaging errors in conventional optics, an image must be projected. This image is projected by the individual "object points" of an actual or real object. The object is precisely registered relative to the lens system under test. For the purposes of this discussion, consider an object with regularly repeating points that may be easily correlated to the corresponding points on the produced image of the object. Further, and to describe the image of the object points, the terms "ideal image points" and "ideal image" are used. The ideal image is that image which would be projected on the image plane from the object if the lens system were perfect or ideal.

In order to correct the optical system in accordance with this invention, it is useful to compute a new set of desired positions near the real object based on the ideal image. The object points located in these desired positions are referred to as the apparent or desired object points and they comprise the apparent or desired object. Further, and with the interferometric testing of the optics herein, it will be desired to have rays of certain angularity be displaced. This desired displacement will be referred to as "desired ray trajectory." It will be noted that this desired ray trajectory may or may not pass through either of its corresponding object positions. As will be made clear hereafter, it is the function of the corrector plates of this invention to make rays originating at or near the actual object, appear to be originating at the apparent object, thereby resulting in the optical system approaching diffraction limited performance. All this will become more clear in reading the following Summary of the Invention.

SUMMARY OF THE INVENTION

An object is projected through the lens system to be corrected to the image plane where the position of the diffraction limited ideal image is readily ascertainable. At least one primary image defect is measured. These aberrations can include but are not limited to distortion, curvature of field or Petzval curvature, spherical aberration, coma, and astigmatism. Distortion, curvature of field and astigmatism are commonly measured by imaging simple known patterns through the system and analyzing their images. Interferometry can be used to measure the aberrations of the system. Based on noninterferometric measurements, the configuration of an apparent object can be simply computed, based on the optical systems parameters such as the magnification. The apparent object is an imaginary location of the object points which would cause the image of the apparent object through the real system to register to the ideal image. One or more plates and their mounts may be required to achieve the desired optical system performance improvements. The first corrector plate is optimized to produce beam deflection. This deflection is chosen so that rays from the object are given optimal displacement to intersect the desired ray trace path (i.e., the rays from the apparent object) at the second corrector plate to correct for the measured aberrations. The second corrector plate is designed so that rays at the second corrector plate, having been previously displaced to the desired ray trace path, are given the required direction to image at the ideal image. In the analysis offered, provision is made to insert inside the optical system a phase conjugate plate for the correction of (fixed) position independent aberrations. A matrix of test points is utilized to locally measure and correct, on a stepper to stepper basis, lens systems through customized corrector plates individually tailored to each lens system. There results a lens system correctly customized which assists in approaching the diffraction limit of the optical system. Both the process and the product of the process is included in the disclosure.

It will be understood that this patent application particularly applies to optical trains found in steppers. As images in such steppers have been required to provide increasingly improved resolution to ever smaller circuits, the use of the techniques here disclosed enables extant steppers to be corrected and used for imaging beyond the design tolerances of their original fabrication. Further, it will be understood that the disclosed process and product of the process can be utilized for the initial lens train fabrication. In this latter case, production tolerance requirements of the original optical elements can be relaxed with reliance on the corrective process and product of the process herein disclosed.

BRIEF DESCRIPTION OF THE DRAWINGS

FIG. 2B is an expanded view of the image plane illustrating the displacement of the real image from the ideal image;

FIG. 3A is an optical schematic of a stepper lens system being subjected to field point interferometry illustrating the path of an interrogating wave front in passing through the lens system and being retro-reflected by a reflecting sphere to measure aberration error within the lens system;

FIG. 3B is a simplified schematic of the corresponding interferogram which could possibly be produced by comparison of the interrogating wave passing through the lens system of FIG. 3A after combination with a reference wave;

DESCRIPTION OF THE PREFERRED EMBODIMENT

In the following specification, the correction of measured lens error will be discussed. Accordingly, this specification will be divided into four subsections. These subsections will include correction of curvature of field and distortion, correction of aberration, correction of systematic construction and lens error, plate design, and finally plate fabrication.

Correction of Curvature of Field and Distortion

Figure 1A:
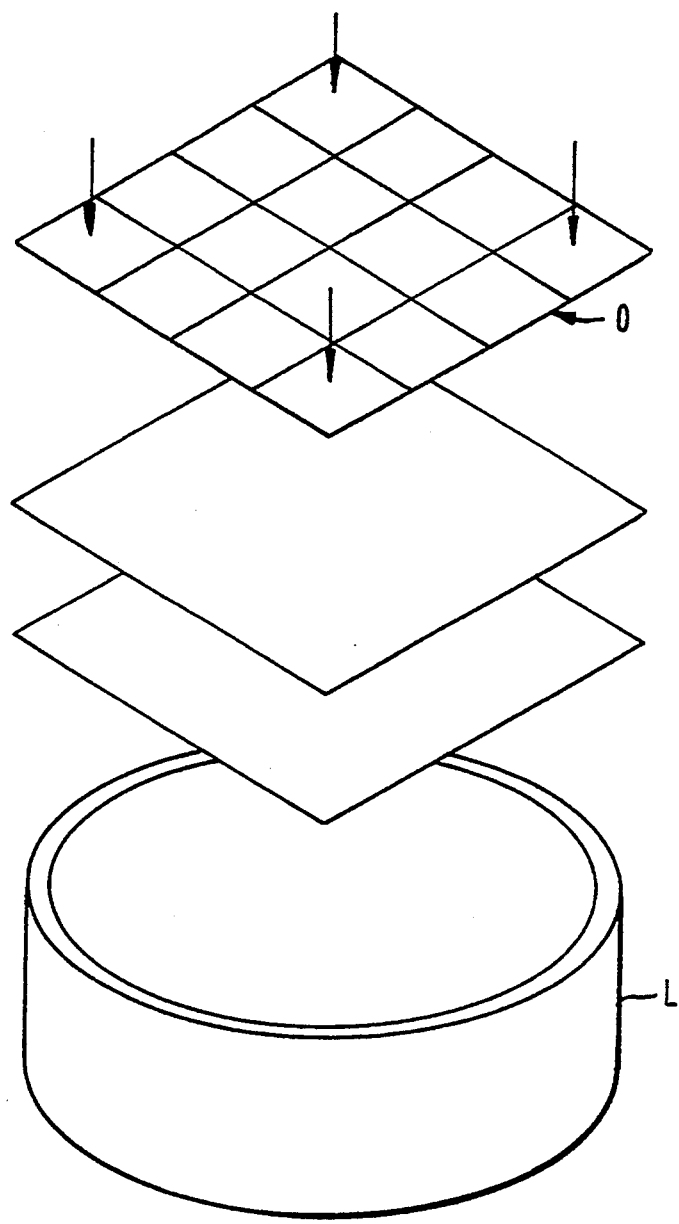
FIG. 1A is a perspective schematic view of an optical stepper lens system, the stepper here being shown projecting a object towards a diffraction limited image I at a conjugate plane with the actual image I' of the object (expanded for illustration) and being shown superimposed and exaggerated with respect to the ideal image.
Figure 1A:
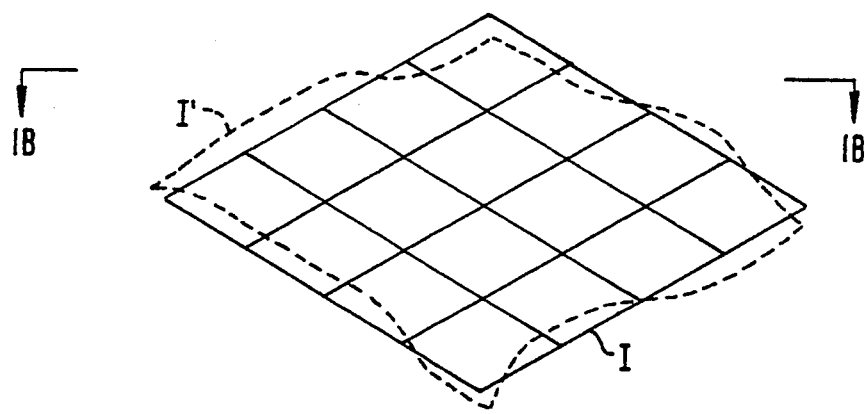

Referring to FIG. 1A, a schematic perspective of the problem solved by this invention is illustrated. Object 0 is projected through a stepper lens system L. Presuming that the lens system was perfect, an ideal image I would occur.

As has been emphasized, this is not the case with real optics. Distortion and curvature of field cause two things to occur. These occurrences are illustrated with respect to FIGS. 1B and 2B.

First, image I' will not register to the plane of ideal image I. Instead, registration will occur a short distance from—either above or below—the plane of ideal image I. This is due to the well known optical defect referred to as curvature of field. All this can be seen in FIG. 1A and 2B.

Figure 1B:
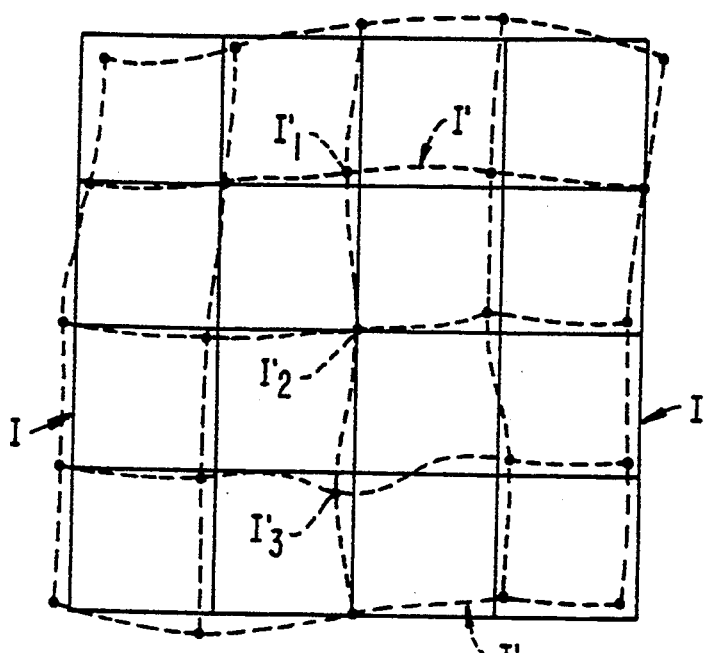
FIG. 1B is a plan view of the real, distorted image relative to the ideal image emphasizing the displacement of the points on the image.

Similarly, the optic effect known as distortion has its own effect. Referring to FIG. 1B, this effect can be noted. Specifically, desired image I is illustrated as a regular array or grid I. Distorted image I' is shown as an irregular array or grid I'.

Figure 2A:
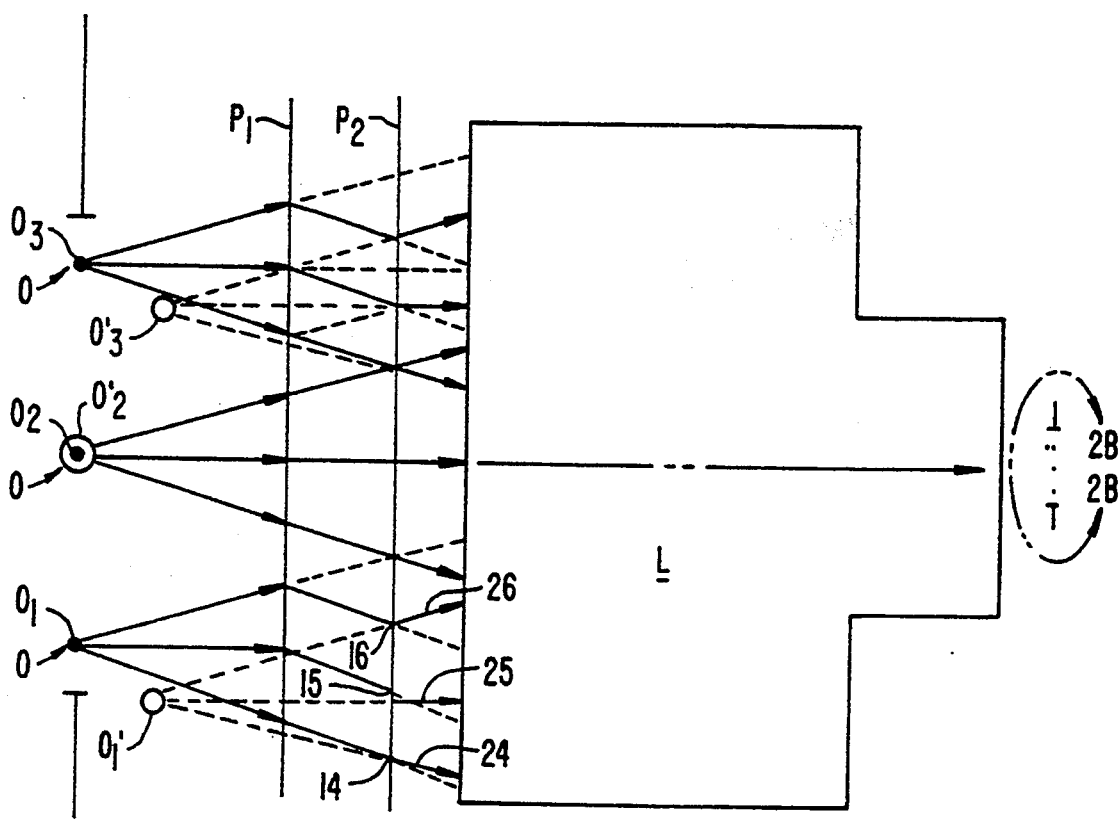
FIG. 2A is a side elevation schematic illustrating the projection of the actual object points with the actual image points displaced from the ideal image (see 2B) and also illustrating the location of the apparent object points away from the actual object with the curvature of field and distortion displacement of the phase plates being schematically illustrated.

The correction of these defects is easily understood. Referring to FIG. 2A, stepper lens system L projects an image of object O. Due to the errors in at least curvature of field and distortion, the real image I' is displaced from that of ideal image I. This displacement is carefully measured at points throughout the image field, both as displacement from the desired focal plane of ideal image I (FIG. 2B) and displacement from the ideal intersection of the points on the image I' (FIG. 1B).

As a most important part of the process of correcting the lens system, a hypothetical—but not real—displacement of the object O is made. Specifically, this displacement answers the question: To what apparent position should object O be displaced to have the image I' of object O register with the ideal image I? This curvature of field and distortion displacement is measured and retained for corrector plate design.

Lens system L is shown here as a wide angle 5 to 1 reduction lens system. In this system, if object point $O_1$ is moved towards lens system L and away from the optic axis to displaced object point $O'_1$, image point $I'_1$ will be both displaced within the plane of ideal image I and registered to the plane of image I (See FIGS. 2A and 2B). In FIGS. 2A and 2B, object point $O_2$ needs no displacement and gets no displacement. Further, object point $O_3$ if moved towards lens system L and towards the optic axis to displaced object point $O'_3$, image point $I'_3$ will be both displaced within the plane of ideal image I and registered to the plane of image I.

Once these respective local displacements are established, the required ray deflections at corrector plates $P_1$ and $P_2$ can be established for correction of curvature of field and distortion (only).

In this description relating to curvature of field and distortion, deflections at these corrector plates will be discussed as if only correction of curvature of field and distortion is required. Other types of aberrations will be ignored. Later, and in the description relating to other types of aberration, curvature of field and distortion will be ignored. It must be emphasized, however, that all of these optical imperfections can be corrected simultaneously. The only reason they are being discussed separately is for ease of discussion and visualization. Additionally, much of the discussion will be as if only one point in the image field matters. Combining measurements from different field points is described below in the "plate construction" section.

Returning solely to the correction of distortion and curvature of field, plate $P_1$ is fabricated so that when light from object O reaches the plane of phase plate $P_2$, that light will coincide with the ray trace path from the desired object position O' to the ideal image I. Thus rays from the actual object position $O_1$ are shown displaced at plate $P_2$ by plate $P_1$ to the ray trace path from the desired object position $O'_1$. It can be seen that this displacement occurs to positions 14, 15, and 16 at plate $P_2$.

It just so happens in the example chosen, that the position of object $O'_2$ happens to be co-incident with the real object position $O_2$. This being the case no displacement is required. Finally, rays from the actual object position $O_3$ are shown displaced at plate $P_2$ by plate $P_1$ to the ray trace path from the desired object position $O'_3$.

Finally, it is required that plate $P_2$ restore ray direction so that object O now apparently emanates from object O'. It can be seen that plate $P_2$ redirects rays to directions 24, 25, and 26.

Further, and looking at object points $O_1$, $O_2$, and $O_3$, two observations can be made. First, the correction required will be different to a high order of probability for each point in the lens system tested. Second, the corrections on both plates $P_1$ and $P_2$ will vary empirically over the surface of the plates to counter discovered error. This empirical variation will to a high order of probability be a non linear variation over the surface of both plates $P_1$ and $P_2$.

Having set forth the correction of curvature of field and distortion, other forms of aberration will now be set forth.

Correction of Aberrations that Degrade Local Resolution

Figure 4:
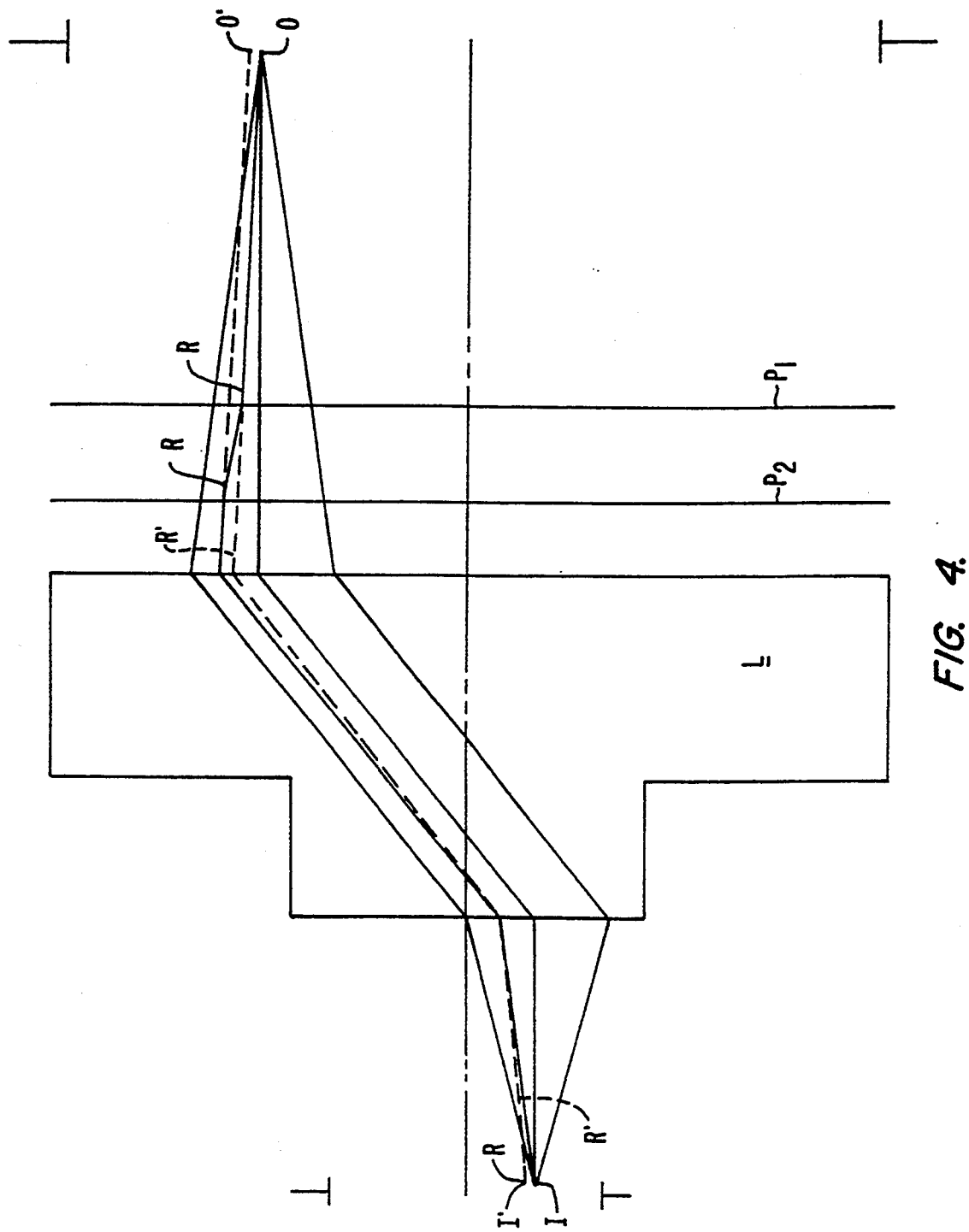
FIG. 4 is a schematic similar to FIG. 3A illustrating the principle of displacing an aberrated ray to a desired ray trajectory to produce convergence at the ideal image.

Referring to FIG. 4, aberration and the correction of aberration set forth in this disclosure can be understood. In FIG. 4, object O is projected through lens system L. Due to aberration—which can include spherical aberration, coma and stigmatism, etc.—a ray R' fails to focus at image I. Instead imaging occurs at I'.

Utilizing the similar correction technique to that previously described, ray deflection occurs at plates $P_1$ and $P_2$. Here, however, it is not the displacement of object O to a desired position. It is instead the displacement of the errant ray R' to an apparent desired trajectory.

Referring again to FIG. 4, the apparent desired origin of ray R is shown at object O'. A ray following this trajectory will focus to image I. Accordingly, plate $P_1$ deviates ray R to that upon arrival at plate $P_2$, the ray R has been displaced to intercept the desired ray trajectory. Similarly, at plate $P_2$ ray deflection occurs so that ray R displaced to the proper position is now given the required ray direction to follow the desired ray trajectory. Correction of the noted aberration results.

Detection of aberration is usually accomplished by conventional interferometry—a technique well known in the prior art. Simply stated, an interrogating wave and a reference wave are generated. The reference wave is transmitted to and returned from an optical path that causes minimal interference with its wave front. The interrogating wave is typically transmitted through and retro-reflected through the optical system to be examined for aberration. By measuring the distortion and field curvature independently from the interferometry, any residual tilt or focus in the interferograms can be removed and ignored. This also relaxes the mechanical requirements of test fixture to maintain sub-depth-of-field positioning of the interferometry equipment to the tested optical system.

FIG. 3A illustrates the wave path of an interrogating wave passing through an optical system containing a defect. The interrogating wave 100—shown in an undistorted plane front—is transmitted to lens system L through lens 101—a lens which causes "perfect" focus of the interrogating wave 100 at object O. Thereafter, the wave diverges and enters lens system L where in this case aberration causes the wave front to form the stepped wave 102. This wave in turn passes through image I and onto reference retro-reflecting sphere 110.

When passing through image I, the wave front will be inverted to front 104.

In transmission to retro-reflecting sphere 110, because of lens aberration defects, ray R will be deviated above image I to image I'—resulting in the "blur" associated with aberration. Further, in reflection from sphere 110, reversal at wave front 112 followed by inversion at wave front 114 occurs. Moreover, passage of ray R through image point I"—a point below image I—occurs. Ray R then passes through lens system L a second time—where a second and added aberration of the ray occurs. Upon retro-refection through lens system L, wave front 116 results—a wave front having twice the original defect. This wave is then interfered with a reference wave—a wave that is substantially undisturbed by the distortions of the lens system. An example of a resulting "interferogram" is shown in FIG. 3B.

Referring to FIG. 3B, the simplified phase transition from FIG. 3A is illustrated. In this phase transition, the lower and dark portion 120 is contrasted to an upper and light portion 121 with a transition region 121 therebetween. It is the information from this phase transition (gradient) that contains the aberration information necessary to design the corrector plates.

Before continuing, some comment can be made about the practical measurements of FIG. 3A. The interferogram in FIG. 3B shows no focus rings and nearly no tilt fringes indicating that the center of the reference sphere was positioned nearly perfectly at the best image point I. In practice, this is not absolutely required, since focus and tilt can be numerically removed from the interferograms. Since distortion and curvature of field are more easily measured by other means, any focus or tilt in the interferograms should be discarded.

There are two substantially different ways to view how to correct the aberration of a given object point's ray bundle with a series of corrector or phase plates.

1. Phase Interpretation

Given that one has measured the aberration sensed by a ray bundle being transmitted through an optic system as in FIG. 3B, the aberration can be corrected for that bundle by a series of plates. As a ray bundle propagates through a series of plates, its transverse dimension grows. The sum of the transversely scaled phases should be the negative or conjugate of the phase measured by the interferometer.

To minimize aberrations at all or a series of object points would require a series of interferograms from different object points. An optimization process would determine complete (and likely constrained in spatial frequency content) plate phases that minimized the residual difference between the measured and scaled sum phases.

2. Ray Interpretation

The ray interpretation of correcting field point aberrations is more compatible with the previous discussions of distortion and field curvature correction. This increased compatibility has the benefit that algorithms to determine the plate phases can deal directly in the same quantities (ray displacements in the image plane) as opposed to having to convert between aberration phases to phase gradients to ray displacements. It should be noted, however, that it is possible to convert distortion and field curvature into phase tilts and quadratics. Generally, if a ray emanating from an object point misses the best focus by a vector, it can be corrected by pre-displacing the ray on the object side by the conjugate of the product of the vector and two scalars (minding all the reflections and coordinate inversions) while leaving its original (object side) direction unchanged. The transverse scalar is simply the magnification ratio and the longitudinal scalar is typically its square.

Having set forth the interrogations of FIGS. 1A and FIG. 3A, the preferred interrogation of this invention can now be understood. Specifically, a typical lens system L would be interrogated for curvature of field and distortion at several tens of different points approximately evenly distributed about the image field of the particular stepper lens system being analyzed. Similarly, and for each of these points, an interferogram on the order of that illustrated in FIG. 3A would be taken. It should be understood that the field of curvature and depth of field measurements are taken on the system uncorrected for aberration or other defects; likewise, the aberration measurements are taken on the lens system uncorrected for curvature of field and distortion.

Correction of Field Position Independent Aberrations

In some instances, a significant portion of the aberration measurements from all the field points may remain constant. Equivalently, the magnitude of the average of all the field points' interferograms may be a reasonable fraction of the magnitude of any of the individual interferograms. The reason for this especially in a reduction imaging system is that the ray bundle footprints largely overlap towards the image end of the lens train where the optics are the thickest and most powerful (most curved). Since the beam footprints overlap the most near the more difficult (per unit area) to make lenses, we can expect the interferograms to have some degree of commonality.

Figure 5A:
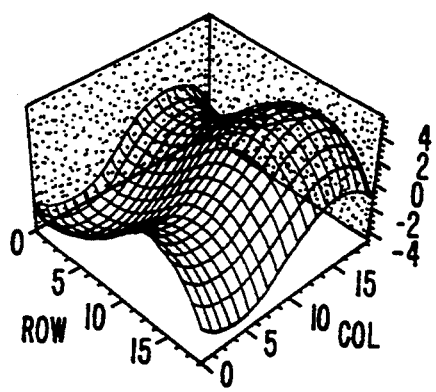
FIGS. 5A-C illustrates a set of interferograms from three different object plane field points.
Figure 5E:
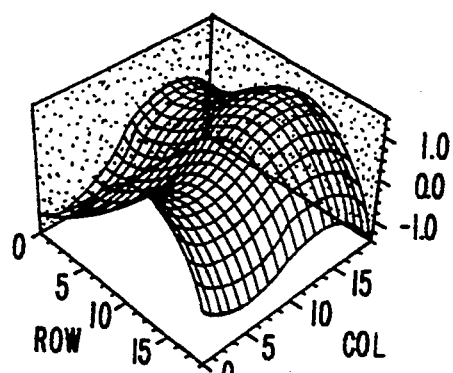
FIGS. 5E-G illustrates the set of interferograms shown in FIGS. 5A-C with the mean interferogram (shown in FIG. 5D) removed.
Figure 5B:
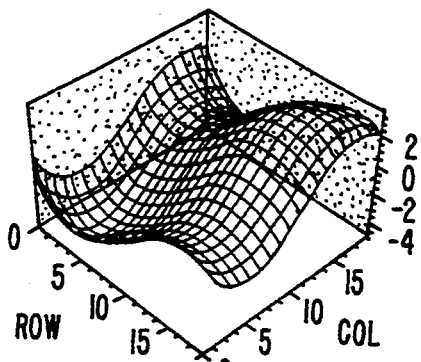
Figure 5F:
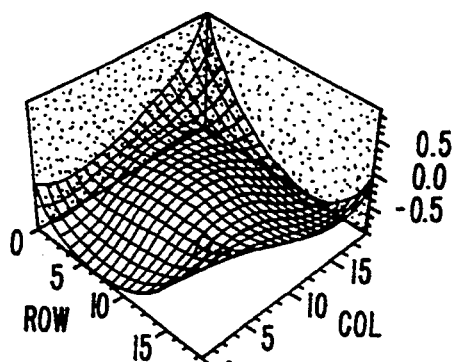
Figure 5C:
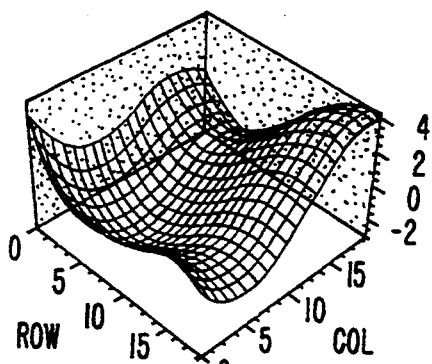
Figure 5G:
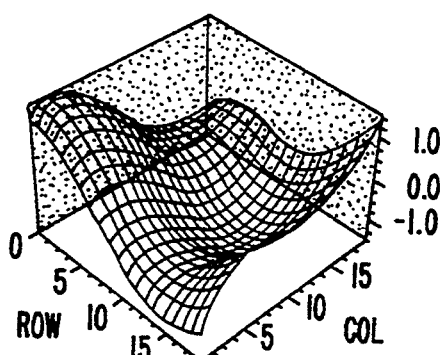
Figure 5D:
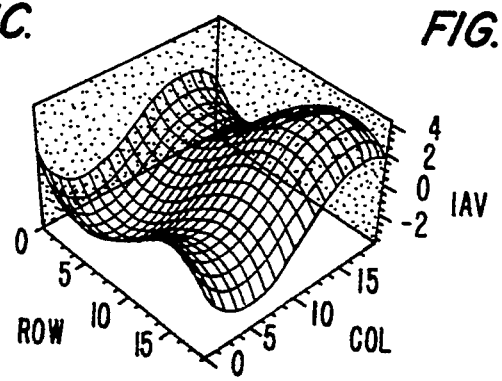
FIG. 5D illustrates the mean interferogram taken from the set of interferograms shown in FIGS. 5A-C.

Thus if the lens system L has a systematic lens error—either a lens surface with a common surface error or a misaligned optical element—similar interference patterns will be noted on adjacent interferograms. FIGS. 5A-C illustrates a set of three interferograms from which a mean interferogram, shown in FIG. 5D, is determined. The mean interferogram is therefore the result of the systematic lens error. FIGS. 5E-G illustrate the same set of interferograms shown in FIGS. 5A-C with the mean interferogram removed.

This is a special case of aberration correction. If the field point interferogram contain a fixed portion (i.e., the average of all the interferograms is not zero) the mean aberration can be corrected by inserting a conjugate phase plate at the aperture stop plane. Accordingly, it is contemplated to manufacture lens systems having within the lens system a position for a correction plate.

Figure 6:
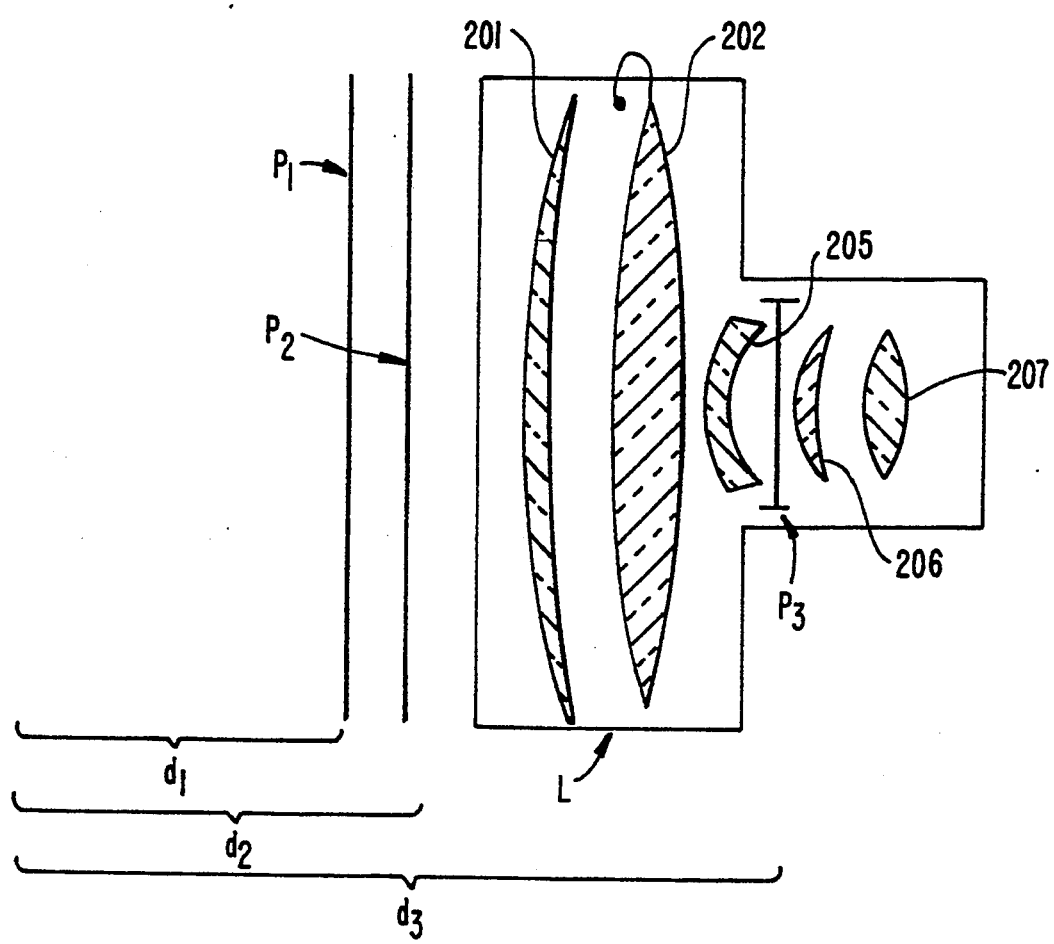
FIG. 6 is a schematic of a stepper lens system with three positions for corrective plates, the first two plates being shown between the object and first element of the lens system and a third plate being shown within the lens system near an aperture stop of the lens system.

By way of example, in FIG. 6, such a system is shown which includes a preferred embodiment for placement of two correcting plates external to a lens system and one plate near the field stop.

Referring to FIG. 6, lens system L is illustrated with multiple lenses 201, 202, 205, 206, and 207. A plate $P_1$ is placed exterior of the entire lens system L a distance $d_1$ from object O. Likewise, a plate $P_2$ is placed at distance $d_2$ from object O.

Plates $P_1$, $P_2$ and $P_3$ together can correct for wide classes of aberration, curvature of field and distortion. Plate $P_3$ is ideally located for the correction of systematic lens error in the system. This plate $P_3$ is either at or adjacent to an aperture stop of lens system L.

Plate Design

Having set forth the measurements of the displacements required for the correction of a measured lens system, attention to the general case of corrector plate design can be set forth. Note that although the ray displacement values were obtained independent of one another, the corrector plate must correct for the cumulative effect of all the aberrations.

If the system has an appreciable average (over field points) aberration and if the system allows access to a plane near the aperture stop, then the first step is to make a corrector plate with the conjugate of the average aberration, placing this plate near the aperture stop plane. Next the number of corrector plates to be employed is determined. A trial and error approach is used starting with a single plate and increasing the number of plates until the desired system performance is achieved. The preferred embodiment uses two corrector plates and a plate near the aperture stop if possible.

For a trial number of plates, a set of plate positions is chosen. These are only the initial positions; final positions are chosen based on the optimization of the system's performance and ability to fabricate the plates. After choosing the plate positions, the plate phase gradients at each ray-plate intersection point must be determined. The gradients are chosen so that the rays appear to be emanating from their respective desired apparent positions (in the absence of the plates) and the rays satisfy the sine condition; i.e., when the ratio of the sine of the angles made between corresponding rays at the object and image points and the axis of the optical system is constant. Satisfying the sine condition implies a reasonable correction for nearby points. Totally disjointed ray bundles can obviously be corrected independently and what remains is to merge the correction smoothly.

For each plate with the total number of desired gradients, a spatial frequency constrained "gradient solver" can be used to get a starting point phase for the plate. Typically a least square fit solver is used. Then a spatial frequency constrained simulated annealing approach can be used with a function of the image plane ray displacements used as the feedback error function. If this process does not achieve the desired performance, new corrector plate locations are chosen and the optimization process is repeated.

Figure 7:
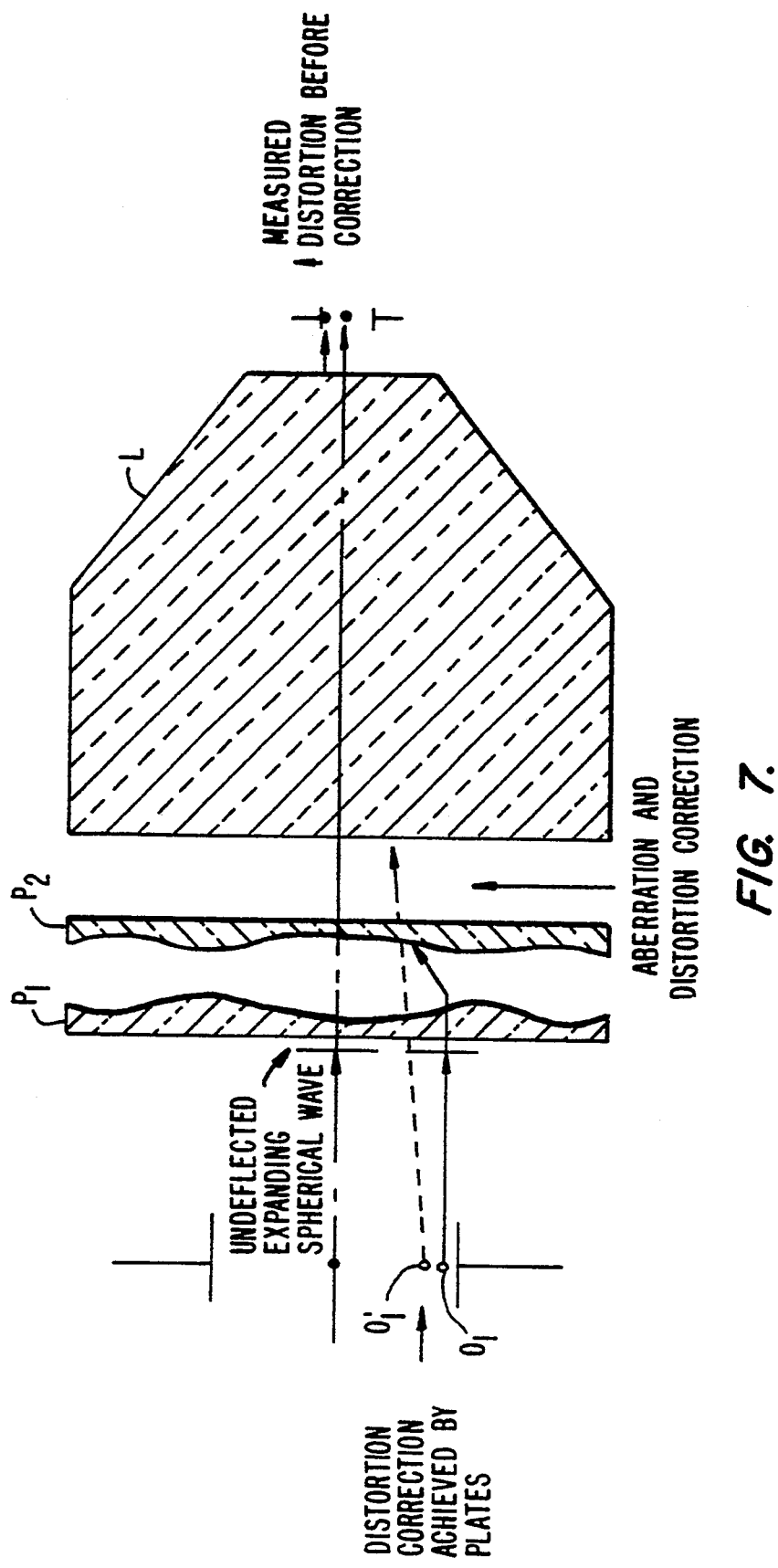
FIG. 7 illustrates a basic corrector plate layout in an optical system correcting astigmatic aberration and quadratic distortion.

FIG. 7 illustrates the basic corrector plate layout in an optical system. $P_1$ and $P_2$ are the corrector plates and L is the lens system. $O_1$ is the actual object point and $O_1'$ is the apparent object point which will yield the desired image point. As described above, $P_1$ causes the ray from $O_1$ to intersect the ray path of $O_1'$ at $P_2$. $P_2$ then adjusts the trajectory of the ray path to coincide with the ray path of the desired object point, $O_1'$. Many possible $O'$ chief ray directions are possible. In general, they will be determined by the corrections occurring elsewhere on the plate(s).

Note that both corrector plate $P_1$ and corrector plate $P_2$ can be made on a single optic. Further, this optic need not be flat.

Plate Construction

Once the phase of the correction plates has been determined, they can be fabricated in one of several ways. For (sufficiently) monochromatic sources, a multilevel, computer generated hologram representation with two pi phase jumps can be used. For wider bandwidth sources, Kinoform plates with phase jumps at multiples greater than one of two pi can be used. For broad band applications, a generalized asphere (referred below as asphere) corrector plate with continuously varying phase can be used. By "asphere" we mean a surface whose departure from an ideal surface (planar or spherical) can be described by a sum of Zernikie or other functions. The resulting surface need not be cylindrically summatric; indeed in the general case it is not. The aspheric and Kinoform plates can be used in narrow band applications as well.

What is claimed is:

1. A process of altering and improving the image quality of an imaging system comprising the steps of:

providing a radiation source;

illuminating an object with said radiation source;

projecting an image of said object along a projection axis through said imaging system to an ideal image plane where the position of a diffraction limited ideal image is readily ascertainable relative to an actual image of the object;

measuring at least curvature of field, distortion, and local astigmatism of said imaging system relative to said diffraction limited ideal image to determine an imaging system performance for a matrix of distributed field points through said imaging system;

calculating a set of apparent object points from a set of ideal image points and the measured imaging system performance such that each apparent object point corresponds to an ideal image point for said matrix of distributed field points through said imaging system;

providing at least two spaced apart corrector plate mounting planes substantially normal to the projection axis of the imaging system for the insertion of a first corrector plate and a second corrector plate within the object to image optical path;

designing a first corrector plate to produce areas of localized beam deflection for said matrix of field points such that a set of light rays emanating from a set of object points will intersect a set of imaginary rays emanating from a set of apparent object points at the second corrector plate;

designing at least a second corrector plate for said matrix of field points such that the direction of the set of light rays emanating from the object are altered so that the actual image and the diffraction limited ideal image coincide; and, inserting the first corrector plate and the second corrector plate into the corrector plate mounting planes.

2. The process of claim 1 and wherein:

said radiation source emits radiation in a visible wavelength regime.

3. The process of claim 1 and wherein:

said radiation source emits radiation in ultraviolet wavelength regime.

4. The process of claim 1 and wherein:

said radiation source emits radiation in soft x-ray wavelength regime.

5. The process of claim 2 and wherein:

said radiation source is monochromatic.

6. The process of claim 2 and wherein:

said radiation source is nearly monochromatic.

7. The process of claim 2 and wherein:

said radiation source is broad band.

8. The process of claim 1 and wherein:

said first corrector plate and said second corrector plate are equivalent to a first surface and a second surface of a single optic.

9. The process of claim 1 and including:
designing a third corrector plate to further coincide the actual image and the diffraction limited ideal image; and,
inserting the third corrector plate into a corrector plate mounting plane.

10. The process of claim 1 and wherein:
one of said corrector plates includes provision for the correction of repeatable error within said imaging system.

11. The process of claim 1 and wherein:
at least one of said corrector plates include a grating.

12. The process of claim 1 and wherein:
one of said corrector plates is located within said imaging system; and,
one of said corrector plates is located without said imaging system.

13. The process of claim 1 and wherein:
at least two corrector plates are located within said imaging system.

14. The process of claim 1 and wherein:
at least two corrector plates are located without said imaging system.

15. The process of claim 1 and including:
measuring for aberration including generating a plurality of interferograms of a set of discrete points on said ideal image;
looking for a common error on said corresponding points on said interferograms; and,
placing a corrector plate within said imaging system having correction for said common error.

16. A process of altering and improving the image quality of an imaging system comprising the steps of:
providing a radiation source;
illuminating an object with said radiation source;
projecting an image of said object along a projection axis through said imaging system to an ideal image plane where the position of a diffraction limited ideal image is readily ascertainable relative to an actual image of the object;
measuring at least one type of aberration of said imaging system relative to said diffraction limited ideal image for a matrix of field points passing through said imaging system;
computing a required deflection of light rays relative to both a first corrector plate mounting plane and a second corrector plate mounting plane such that the image of the object produced by said deflected rays through said matrix of field points will converge with the diffraction limited ideal image; and
designing and inserting a first corrector plate into the first corrector plate mounting plane and a second corrector plate into the second corrector plate mounting plane to produce the required deflection of light rays for said matrix of field points such that rays corresponding to said measured field points converge toward said diffraction limited ideal image.

17. A process of altering and improving the image quality of an imaging system comprising the steps of:
providing a radiation source;
illuminating an object with said radiation source;
projecting an image of said object along a projection axis through said imaging system to an ideal image plane where the position of a diffraction limited ideal image is readily ascertainable relative to an actual image of the object;
measuring at least one type of aberration of said imaging system relative to said diffraction limited ideal image for a matrix of field points through said imaging system;
computing a required deflection of light rays relative to a corrector plate mounting plane such that the image of the object produced by said deflected rays will converge with the diffraction limited ideal image for said matrix of field points taken through said imaging system; and
designing and inserting a corrector plate into the corrector plate mounting plane to produce the required deflection of light rays towards said diffraction limited ideal image of said imaging system.

18. A process of altering and improving the image quality of an imaging system having an image and object plane comprising the steps of:
providing a radiation source;
illuminating an object with said radiation source;
measuring for aberration including generating a plurality of interferograms taken from a set of discrete field points on one of said planes;
determining a common error on said interferograms taken at said set of discrete field points;
subtracting said common error from each said interferogram to determine a local correction for each said discrete field point;
utilizing said local corrections to map aberration corrections for said set of discrete points;
providing at least two spaced apart corrector plate mounting planes substantially normal to the projection axis of the imaging system for the insertion of a first corrector plate and a second corrector plate within the object to image optical path;
designing a first corrector plate to produce areas of localized beam deflection such that said local correction for each discrete field point will cause a set of light rays emanating from said discrete point to intersect a set of imaginary rays at the second corrector plate having the desired corrected trajectory of light from said discrete field points;
designing at least a second corrector plate such that said local correction for each discrete point will alter the direction of the set of light rays emanating from the second corrector plate so that the rays converge to the desired trajectory of light from said discrete field points; and,
inserting the first corrector plate and the second corrector plate into the corrector plate mounting planes.

19. The process of claim 18 and including:
designing a third corrector plate to compensate for said common error; and
inserting said third corrector plate near an aperture stop of the imaging system.

20. An imaging system product corrected towards a diffraction limited condition for projecting through the imaging system along a projection axis within a optical path an image to an image plane of an object from an object plane comprising:
providing said imaging system;
providing at least two spaced apart corrector plate mounting planes substantially normal to the projection axis of the imaging system for the insertion of first and second corrector plates within the object to image optical path with at least one of said corrector plate mounting planes being outside of said imaging system;

measuring at least curvature of field, distortion, and aberration of said imaging system for a matrix of field points through said imaging system;

designing and inserting to one of said corrector plate mounting planes a first corrector plate to produce beam deflection at said matrix of field points so that rays intersect a path at the second corrector plate to converge on the ideal image; and, designing and inserting a second corrector plate for said matrix of field points so that rays at the second corrector plate are given the required direction to converge on the ideal image.

21. The product of claim 20 and wherein:

said first corrector plate is an asphere producing beam deflection from a desired object position to intersect said path at said second corrector plate from said desired object position to said ideal image.

22. The product of claim 20 and wherein:

said second corrector plate is an asphere producing beam deflection to a desired trajectory to said ideal image.

23. The product of claim 20 and wherein:

one of said spaced apart corrector mounting planes is located within said imaging system; and, the other of said spaced apart corrector mounting planes is located without said imaging system.

24. The product of claim 23 and wherein:

one of said corrector plates is placed in the middle of said system and includes provision of for the correction of repeatable error within said imaging system.

25. The product of claim 20 and wherein:

both said plates are without said imaging system.

26. The product of claim 20 and including:

an asphere within said imaging system generated by;

measuring said imaging system for aberration including generating a plurality of interferograms of discrete field points on said ideal image;

looking for common error on said plurality of interferograms of said discrete field points; and, placing an asphere on said corrector plate within said imaging system having correction for said common error.

27. An imaging system having a first corrector plate at said first corrector plate plane and a second corrector plate at said second corrector plate plane, said corrector plates manufactured by the process of claim 1.

28. An imaging system having a corrector plate at said corrector plate plane, said corrector plate manufactured by the process of claim 17.

29. An imaging system having a first corrector plate at said first corrector plate plane and a second corrector plate at said second corrector plate plane, said corrector plates manufactured by the process of claim 18.

30. An imaging system having a first corrector plate at said first corrector plate plane and a second corrector plate at said second corrector plate plane, said corrector plates manufactured by the process of claim 20.

* * * * *